United States Patent [19]

Dennard et al.

[11] 4,095,251
[45] June 13, 1978

[54] FIELD EFFECT TRANSISTORS AND FABRICATION OF INTEGRATED CIRCUITS CONTAINING THE TRANSISTORS

[75] Inventors: Robert H. Dennard, Croton-on-Hudson; Dominic P. Spampinato, Ozone Park, both of N.Y.

[73] Assignee: International Business Machines Corporation, Armonk, N.Y.

[21] Appl. No.: 715,948

[22] Filed: Aug. 19, 1976

[51] Int. Cl.² ............................................ H01L 29/78
[52] U.S. Cl. ....................................... 357/23; 357/45; 357/49; 357/59
[58] Field of Search ........................ 357/23, 45, 49, 59

[56] References Cited
U.S. PATENT DOCUMENTS 3,936,859  2/1976  Dingwall ............................... 357/23

*Primary Examiner*—Edward J. Wojciechowicz
*Attorney, Agent, or Firm*—Pollock, Vande Sande & Priddy

[57] ABSTRACT

A field effect transistor (FET) wherein the field insulator is nonrecessed with respect to the source and drain regions, wherein the sides of the polysilicon gate electrode are self-aligned with respect to the nonconductive field insulator and neither overlap nor underlap the field insulator. The lateral dimensions and location of the gate correlate directly with the lateral dimensions and location of the channel region of the FET. The gate fabrication technique employed comprises delineating lithographic patterns twice in the same polysilicon layer; whereby the first lithographic pattern delineates regions to be used for sources and drains, and the next lithographic pattern forms the gate regions.

24 Claims, 21 Drawing Figures

FIELD EFFECT TRANSISTORS AND FABRICATION OF INTEGRATED CIRCUITS CONTAINING THE TRANSISTORS

BACKGROUND OF THE INVENTION

The preent invention relates generally to field effect transistors (FETs) and to the preparation of integrated circuits containing a plurality of the FETs. More particularly, the present invention is related to a novel FET having a field insulator which is nonrecessed with respect to the source and drain regions, and having a polycrystalline silicon gate which is self-aligned with respect to both conductive and nonconductive regions, and to a method for fabricating such FETs and integrated circuits containing a plurality of such FETs. The present invention requires only four basic lithographic (pattern delineating) masking steps to achieve the desired integrated circuit containing an array of FETs and the associated addressing, decoding, sensing, and/or clocking circuits which are positioned peripherally to the array.

The FET is an important electrical switching device in large scale integrated circuits. Such circuits may contain tens or even hundreds of thousands of FETs on a single semiconductor chip. Such chips typically measure less than one quarter of one inch on a side. The physical size (i.e., the lateral dimensions) of the FET switching device and the ease of electrically interconnecting a plurality of FETs are important factors in determining how closely devices may be packed into a given chip area. Thus, the degree of integration is in part determined by the device packing density. Accordingly, continuing work is being carried out to provide new masking and etching procedures which will yield the minimally smallest structure for a given lithographic feature size without significantly increasing the complexity of the fabrication process.

The choice of the conductive gate material for the FET influences the properties of the FET and the procedure for fabricating the FET. The most common gate materials are aluminum (a low-melting temperature metal) and polysilicon (a high-melting temperature nonmetal). Gate materials less commonly used in the industry are high-melting temperature metals such as tungsten and molybdenum which, nevertheless, tend to become unstable from exposure to high processing temperatures. The present invention relates generally to FETs wherein the gate is of polysilicon.

In the fabrication of FETs, it is desirable to use polysilicon for the gate of the FET. As is well known in the art, polysilicon is an attractive FET gate material because of its ability to withstand high processing temperatures without degradation. Furthermore, polysilicon offers potentially higher gate oxide reliability than other gate materials. In addition, polysilicon can serve as an interconnection material. Moreover, conductive or semiconductive polysilicon can be converted to nonconductive (insulating) silicon dioxide by high temperature exposure to, for instance, oxygen or water vapor. Furthermore, polysilicon can be coated with an insulating layer such as a silicon dioxide or silicon nitride layer by chemical vapor deposition at high temperature. In addition, it is relatively easy to fabricate source and drain regions self-aligned with respect to the edges of a polysilicon gate. In the self-aligned gate technique, the polysilicon gate is delineated prior to forming the source and drain regions. The edges of the gate material and the edges of the field isolation regions serve as a mask for defining the boundaries of the diffused or ion implanted source and drain regions. A method of fabrication for ion implanted self-aligned source and drain regions is described in "Design of Ion-Implanted MOSFET's with Very Small Physical Dimensions" by R. H. Dennard et al, IEEE J. Solid-State Circuits, Vol. SC-9, pp. 256–268 (October 1974).

In known polysilicon gate FETs, the sides of the channel region are defined by the thick insulation region, commonly referred to as the field isolation region, and the polysilicon gate extends up onto (i.e., overlaps onto) the field isolation regions. The field isolation is typically of silicon dioxide and can exist above, or may be partially or fully recessed into the semiconductive substrate with respect to the source and drain regions.

In FET structures known in the art, the sides of the channel are determined by the field isolation oxide and the polysilicon gate overlaps onto this field oxide. This overlap is necessary because the field isolation lithographic pattern and the polysilicon gate lithographic pattern cannot be automatically registered with respect to one another. Consequently, a misregistration tolerance (i.e., a pattern overlap) must be provided to insure that the source and drain do not electrically short together. This required gate overlap undesirably consumes extra area. Furthermore, at the edges of the polysilicon, a topological step occurs which can lead to coverage problems for subsequently fabricated insulation layers and metallic interconnection lines. An example of the polysilicon overlap and the resultant step in the cross section is illustrated in FIG. 1 of "Uses of Ion Implantation in Advanced MOS Field-Effect Transistors", ECS Fall Meeting Extended Abstracts, Volume 75-2, pp. 326–329, October 1975 by Dennard et al.

Therefore, an object of the present invention is to provide FETs wherein the polysilicon gate does not overlap onto the field isolation. A further object of the present invention is to provide FETs wherein the field isolation is nonrecessed with respect to the FET source and drain regions.

It is also an object of the present invention to provide FETs of reduced overall area without increasing the number of basic lithographic masks used to obtain such. Still another object of the present invention is to provide FETs with a polysilicon gate that is self-aligned with respect to both the conductive source and drain regions on its ends, and to the nonconductive field isolation on its sides. This double self-alignment feature results in a polysilicon gate, the lateral dimensions and location of which correlate directly with the lateral dimensions and location of the channel region of the FET and, therefore, the polysilicon gate material neither overlaps nor underlaps the field isolation regions.

FET integrated circuits are fabricated using a sequence of lithographic masking, exposing, and etching steps. In order to delineate the field isolation; gates of the FET; contact holes to gates, sources, and drains; and metallic interconnection pattern, a minimum of four basic lithographic pattern delineations are generally required. The lithographic masking steps involved in preparing integrated circuits are among the most critical. The lithographic masking steps require high precision in registration (i.e., in relative mask-to-mask alignment) and extreme care in execution. If the misregistration from mask-to-mask is too large, electrical shorts or opens in the integrated circuit will appear and the circuit will not function correctly. Consequently, a misregistration tolerance must be provided to allow for mask-to-mask alignment difficulties. All lithographic exposure systems have a finite misregistration due to the inherent physical limitations that naturally occur in an electromechanical system. Furthermore, each additional lithographic masking step in a process introduces possible surface damage due to mask defects, and increases mask-to-mask registration problems that decrease the processing yield and, accordingly, significantly increase the fabrication cost. A basic objective in FET integrated circuit fabrication is to provide a mask sequencing and associated geometrical layout technique that will result in structure which are more tolerant of mask-to-mask misregistration and yet which provide FET structures of small overall size, without increasing the number of lithographic masking steps.

Accordingly, an object of the present invention is to provide a technique which is more tolerant of mask-to-mask misregistration and which also provides relatively small area FETs. Another object of the present invention is to provide a fabrication process for producing FET integrated circuit arrays which requires a minimum number of lithographic masking (pattern delineating) steps.

In the polysilicon gate FET technology, the polysilicon regions must be electrically connected to highly conductive metallic interconnection lines. In the present invention, this connection can be made by growing and/or depositing an insulating layer over the gate, and then delineating and etching a contact hole or via through the insulating layer. However, such a method of providing electrical connection between the polysilicon gate and the metallic interconnection line suffers from the problem that the polysilicon lithographic pattern and the via lithographic pattern cannot be perfectly registered with respect to one another. Similarly, the via lithographic pattern and the metallic interconnection line lithographic pattern also cannot be perfectly registered with respect to one another.

A fabrication sequence which eliminates this particular problem of contact alignment between the polysilicon gate and the metallic interconnection line and which is preferably employed in the present invention is discussed by Kalter et al. in IBM Technical Disclosure Bulletin, Volume 14, No. 10, p. 3176, March 1972, and by Rideout in IBM Technical Disclosure Bulletin, Volume 17, No. 9, p. 2802, February 1975. Both IBM Technical Disclosure Bulletin publications describe polysilicon gates that overlap onto the field isolation regions. The fabrication process suggested by Kalter et al provides a polysilicon gate FET in which a metal line is "self-registered" with respect to a polysilicon gate, wherein oxidation over the polysilicon gate is prevented by an oxidation barrier gate-masking layer. When the oxidation barrier layer is removed, the entire gate area is revealed for contacting. A metal word line such as aluminum that crosses the polysilicon gate will provide an electrical connection to that gate. Because the entire gate area is revealed, the metal word line and the polysilicon gate advantageously do not need to be precisely registered with respect to each other in order to make electrical connection. Much more precise registration is required, however, when the metal line must contact the polysilicon gate via a conventional contact hole etched through an oxide layer that exists over the gate.

Still another object of the present invention is to provide FETs with improved resistance to electrical leakage as well as having a highly planar surface topology upon which to delineate the metallic-type interconnection pattern. These are accomplished by providing field isolation which is nonrecessed with respect to FET source and drain regions, and by eliminating overlap of the polysilicon gate material onto the field isolation together with providing the upper surface of the field isolation at the same level as the upper surface of the polysilicon gate when desired.

The isolation thickness according to the present invention can be approximately the same over the source and drain regions as it is over the field regions thereby giving desirable low capacitance between source and drain regions and metallic type interconnection lines which cross thereover. In the present invention, the nonrecessed field isolation is approximately planar surrounding the source and drain junctions and thereby beneficial reduction of leakage in the junctions is realized.

A still further object of the present invention is to provide a plurality of FETs of very high packing density interconnected to form an integrated circuit wherein the FETs have been formed on the same semiconductive substrate.

In addition, it is an object of the present invention to provide FET integrated circuit arrays having all of the following desirable aspects:

(1) thick field isolation located between FETs of the array;
(2) field isolation nonrecessed with respect to upper surface of the source and drain regions of the FET;
(3) doped polysilicon gate self-aligned with respect to the field isolation region;
(4) doped source and drain self-aligned with respect to the polysilicon gate;
(5) a metallic-type high electrical conductivity interconnection line;
(6) electrical connection between the doped polysilicon gate and the metallic-type high electrical conductivity interconnection lines;
(7) contact holes or vias for connecting source and drain regions to interconnection lines; and
(8) electrical connection to semiconductive substrate.

A further object of the present invention is to provide a fabrication process which requires a minimum number of basic lithographic masking steps in order to prepare integrated circuit arrays containing FETs having all of the above-described desirable characteristics.

SUMMARY OF THE INVENTION

The present invention is concerned with a field effect transistor (FET) wherein the field insulator is nonrecessed with respect to the source and drain regions; wherein the sides of its gate electrode are self-aligned with respect to the boundaries of the field insulator and neither overlap nor underlap the field insulator; and to a method for fabricating a semiconductor integrated circuit comprising a semiconductive substrate having at least one such transistor formed therein. Each FET has source, drain and channel regions and the conductive source and drain regions are self-aligned with respect to the ends of the gate conductor. Electrical connections can be made to source, drain, gate, and substrate regions for the purpose of applying or obtaining electrical signals. In an integrated circuit, the FET generally acts as a switch to allow or prevent electrical signals from being conducted, or as an amplifier to magnify weaker signals.

A further aspect of the present invention is concerned with an integrated circuit array containing a plurality of the FETs described hereinabove.

The FETs of the present invention can be used to form an integrated circuit array such as a random access memory array, and to form addressing, decoding, sensing, and clocking circuits positioned peripheral to the array of FETs. These peripheral FET circuits are generally fabricated on the same integrated circuit chip and with the same fabrication process as is used for the array of FETs.

A still further aspect of the present invention is concerned with FETs of the type described hereinabove which further include a polysilicon field shield and particularly a field shield which does not overlap onto the gate.

Another aspect of the present invention is concerned with integrated circuit arrays containing a plurality of the above-described FETs containing field shields.

Another aspect of the present invention is concerned with an FET one-device memory cell of an FET switch of the type described hereinabove and a charge storage capacitor.

Another aspect of the present invention is concerned with integrated circuit arrays containing a plurality of the above-described FET one-device memory cells.

A further aspect of the present invention is concerned with fabricating FETs and integrated circuits thereof of the types discussed hereinabove.

The fabrication method to be described hereinbelow provides an FET which is surrounded by a relatively thick oxide isolation region, commonly referred to as the field oxide. The field oxide electrically isolates one FET from other FETs which are present on the same semiconductive substrate. The field oxide is generally formed by thermal oxidation of the semiconductive substrate after the second mask pattern delineation. The field isolation oxide is nonrecessed with respect to the upper surface of the source and drain regions.

The gate of the FET is of polysilicon and is generally doped to the same conductive type as the source and drain. According to the present invention, the FET device regions and the gate regions are fabricated by delineating lithographic patterns twice in the same polysilicon layer. The first lithographic pattern delineates the regions which are to be doped to provide the sources and drains and the next lithographic pattern forms the gate regions. In this manner the edge of the gate is self-aligned not only with respect to the common boundaries of the source and drain but also with respect to all of the other boundaries of the source and drain. In fact, this eliminates the area identified as "a" in FIGS. 1A and 3A previously needed for assuring alignment between the gate and doped source and drain regions. This alignment space is normally about one-half of a line width. This is followed by providing field isolation and thereby providing for self-alignment of the boundaries of the field isolation and the gate with respect to one another.

In order to form an array of randomly addressable FETs, electrically conductive lines are connected to FET gates in the array. These lines must cross over and be electrically insulated from the doped source and drain regions of the FETs in the array. Other access lines of the array may be formed by extending the sources (or drains) of the FET and connecting many such sources (or drains) together. Sources (or drains) can also be connected together by using a metallic interconnection line and contact holes of "vias" through the insulating layer to provide access to source (or drain) regions.

The present invention is also concerned with a method for fabricating an integrated circuit containing an array of FETs having field isolation between FETs wherein the field isolation is nonrecessed with respect to source and drain regions and wherein FETs of the array have a polysilicon gate with sides self-aligned with respect to the field isolation in the width direction and the gate neither overlapping nor underlapping the field isolation; and source and drain regions being self-aligned to the ends of the gate in the length direction which comprises:

(A) providing a semiconductive substrate of a first conductive type containing active impurities of a first conductive type;

(B) providing an insulating layer on said substrate which is to be subsequently delineated to provide FET gate insulators;

(C) depositing and doping a layer of polycrystalline silicon above said insulating layer;

(D) delineating first predetermined polycrystalline silicon regions to provide etched regions which are to be subsequently doped for forming the source and drain regions;

(E) thermally diffusing or ion implanting active impurities of a second and opposite type into the etched regions of the semiconductive substrate to provide FET source and drain regions;

(F) delineating subsequent predetermined pattern in the remaining polysilicon regions to provide polycrystalline silicon gate regions of the FETs;

(G) providing an insulating layer over at least the source and drain regions, and over the field regions;

(H) delineating contact holes to provide vias for achieving electrical connection between interconnection lines and FET source and drain regions; and (I) depositing and delineating a metallic-type high conductivity electrical interconnection pattern that makes electrical connection to the polysilicon FET gates, and to FET sources and drains.

Electrical connection to the semiconductive substrate can be made by delineating contact holes to provide vias either prior to, subsequent to, or along with delineating contact holes to provide vias for achieving electrical connection to the source and drain regions. Also, electrical connection can be made by applying to the backside or bottom of the semiconductive substrate a metallic-type high electrical conductivity material.

The fabrication steps described above make it possible to provide the desired array of FETs and peripheral FET circuits with only four basic lithographic masking steps. The four basic lithographic masking (pattern delineating) fabrication steps employed are as follows:

(1) delineating pattern to provide for source and drain regions;

(2) delineating FET gate pattern;

(3) delineating contact hole pattern to provide vias to source and drain regions; and (4) delineating high-conductivity interconnection line pattern.

It is noted that polysilicon gates are formed wherever above-described pattern (2) overlaps the area outside of pattern (1). It is further noted that mask pattern (3) above may also be used to delineate contact holes to provide vias to substrate regions when desired.

The present invention is also concerned with an integrated circuit comprising an array of FETs prepared by the method describe above and associated circuits peripheral to the array of FETs.

Also, the present invention is directed to a method for fabricating an integrated circuit containing an array of FETs having field isolation between FETs wherein the field isolation is nonrecessed with respect to source and drain regions, and wherein FETs of the array have a polysilicon field shield located within the field isolation, a polysilicon gate with sides self-aligned with respect to the field isolation in the width direction and the gate neither overlapping nor underlapping the field isolation, and source and drain regions being self-aligned to the ends of the gate in the length direction which comprises:

(A) providing a semiconductive substrate of a first conductive type containing active impurities of a first conductive type;

(B) providing an insulating layer on said substrate which is to be subsequently delineated to provide FET gate insulators;

(C) depositing and doping a layer of polycrystalline silicon;

(D) delineating first predetermined polycrystalline silicon regions to provide etched regions which are to be subsequently doped for forming the source and drain regions;

E thermally diffusing or ion implanting active impurities of a second and opposite type into the etched regions of the semiconductive substrate to provide FET source and drain regions;

(F) delineating subsequent predetermined patterns in the remaining polysilicon regions to provide polycrystalline silicon gate regions and field shield regions of the FETs;

(G) providing insulating layer over the source and drain regions, and over the field regions, including over the field shield regions;

(H) delineating contact holes to provide vias for achieving electrical connection between interconnection lines and FET source and drain regions; and (I) depositing and delineating a metallic-type high conductivity electrical interconnection pattern that makes electrical connection to the polysilicon FET gates, and to FET sources and drains.

The present invention is also concerned with an integrated circuit comprising an array of FETs containing field shields prepared by the method described above and associated circuits peripheral to the array of FETs.

Also, the present invention is directed to a method for fabricating an integrated circuit containing an array of FET one-device memory cells having field isolation between cells being nonrecessed with respect to source and drain regions and wherein memory cells of the array have doped polysilicon gates, polysilicon upper storage capacitor electrodes, self-alignment between field isolation and the sides of the gate in the width direction, the gate neither overlapping nor underlapping the field oxide isolation; source and drain regions being self-aligned to the ends of the gate in the length direction; and metallic-type high electrical conductivity interconnection line; which comprises:

(A) providing a semiconductive substrate of a first conductive type containing active impurities of a first conductive type;

(B) delineating predetermined regions to define the charge storage capacitor regions;

(C) thermally diffusing or ion implanting active impurities of a second and opposite type into said predetermined regions of the semiconductive substrate to provide doped lower storage capacitor electrodes;

(D) providing insulator layer on said substrate, which insulator layer is to be subsequently delineated to provide the gate insulator;

(E) depositing and doping a layer of polycrystalline silicon;

(F) delineating first predetermined polycrystalline silicon regions to provide etched regions which are to be subsequently doped for forming the source and drain regions;

(G) thermally diffusing or ion implanting active impurities of a second and opposite type into the etched regions of the semiconductive substrate to provide FET source and drain regions;

(H) delineating subsequent predetermined pattern in the remaining polysilicon regions to provide polycrystalline silicon gate regions and upper storage capacitor electrodes;

(I) providing insulating layer over the source and drain regions, and over the upper capacitor electrode regions;

(J) delineating contact holes to provide vias for achieving electrical connection to upper capacitor electrodes; and to source and drain regions in circuits peripheral to the array of memory cells; and (K) depositing and delineating a metallic-type high conductivity electrical interconnection pattern that makes electrical connection to the polysilicon FET gates; to upper capacitor electrodes, and to sources and drains in circuits peripheral to the array of memory cells.

The present invention is also concerned with an integrated circuit comprising an array of FET one-device memory cells prepared by the method described above and associated circuits peripheral to the array of memory cells.

FURTHER DESCRIPTION OF THE DRAWINGS

Figure 1A:
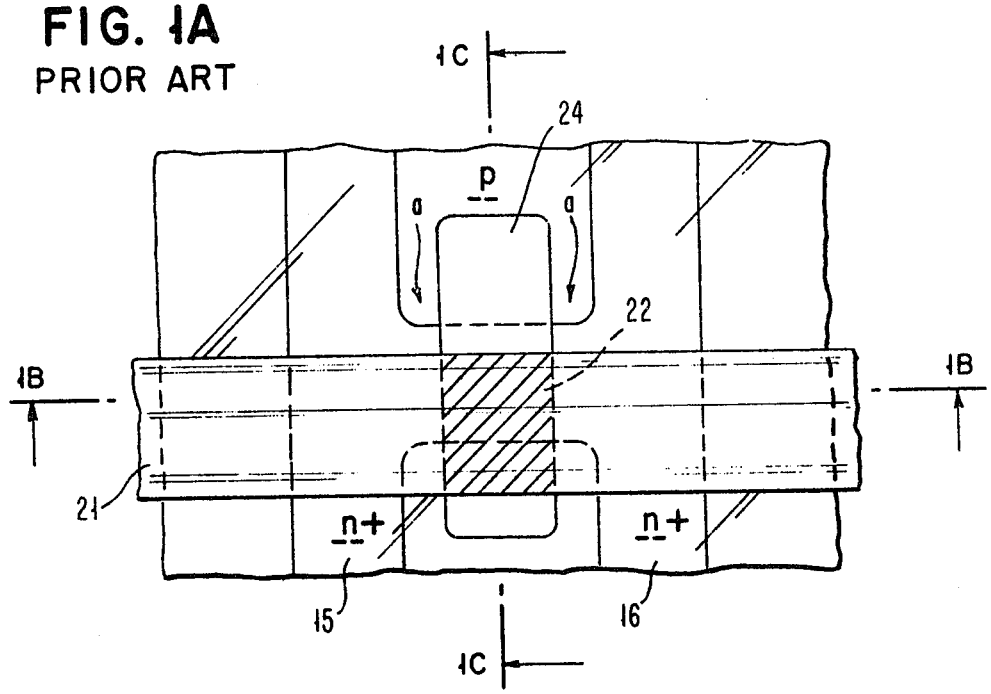
FIG. 1A illustrates a top view of an FET with an overlapping polysilicon gate and a misregistration tolerant gate contact made according to the method suggested by Kalter et al referred to hereinabove.

Referring to FIG. 1A, there is shown a top view of an FET made according to the method of Kalter et al in IBM Technical Disclosure Bulletin, Volume 14, No. 10, page 3176, March 1972, that provides an FET in which a metallic interconnection line 21 makes a "self-registered" electrical connection 22 to a polysilicon gate 24. In the fabrication process disclosed by Kalter et al, oxidation over the polysilicon gate is prevented by an oxidation barrier masking layer. When the oxidation barrier layer is removed by an etchant, the entire gate area is revealed for contacting. A metallic interconnection line 21 such as one of aluminum that crosses the gate will provide an electrical connection 22 to the gate 24. Because the entire polysilicon area is revealed, the metal line and the polysilicon gate lithographic patterns advantageously do not need to be precisely registered with respect to each other in order to make electrical connection. Much more precise registration is required, however, when the metal line must contact the polysilicon gate via a conventional contact hole etched through an oxide layer that exists over the gate.

Figure 1B:
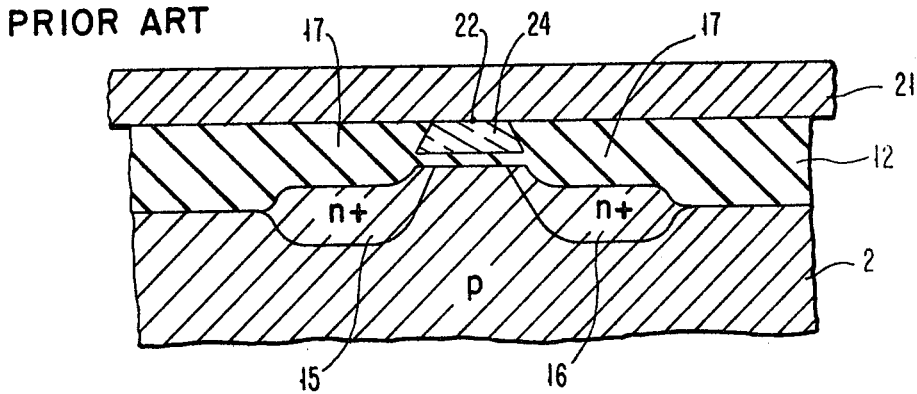
FIGS. 1B and 1C show cross sectional views through the overlapping gate FET along the lines indicated in FIG. 1A.
Figure 1C:
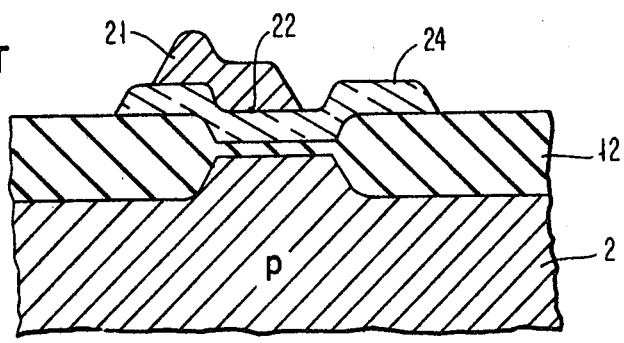

As illustrated in FIGS. 1A and 1C the field isolation and the polysilicon gate 24 are not self-aligned, and hence the gate material must overlap onto the field isolation oxide 12 to prevent the source 15 and drain 16 from shorting together. When viewed in cross section, the FET of FIG. 1A exhibits a highly planar topology along the channel from source to drain (see FIG. 1B), but not across the channel (see FIG. 1C) due to the overlapping gate structure. This nonplanar topology can lead to fabrication difficulties. For example, the metallic interconnection line 21 must be thick enough to accommodate the undulating polysilicon gate layer and to avoid thinning of or breaks in the metallic line (see FIG. 1C). In addition, the resist layer used to transfer the metallic interconnection layer pattern from a master mask to the substrate will experience the same undulations, and thickness variations may occur in the resist which is usually applied onto a spinning substrate. This can lead to a loss of resolution in edge definition for metal lines which may disadvantageously require wider line widths with a resultant reduction in device packing density. Furthermore, a nonplanar surface can cause a loss of resolution in edge definition due to variations in the depth of field exposed. The lithographic delineation problems associated with semiconductor surfaces that are not truly planar become more acute as attempts are made to scale down FETs to smaller and smaller dimensions.

Figure 2A:
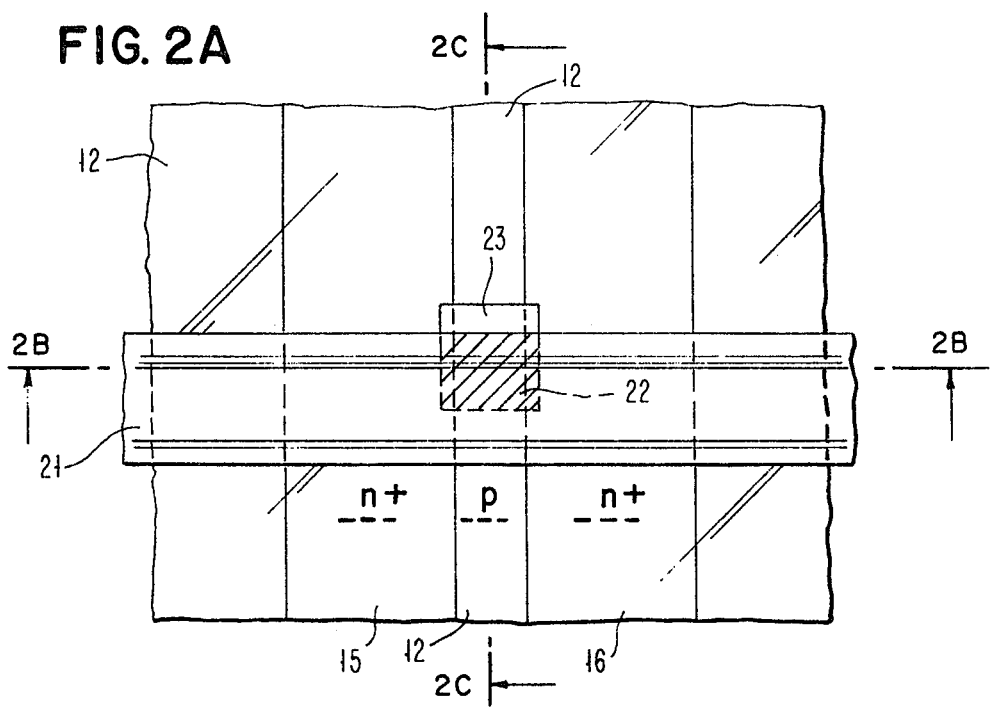
FIG. 2A illustrates a top view of an FET of the present invention wherein the polysilicon gate does not overlap the field isolation.
Figure 2B:
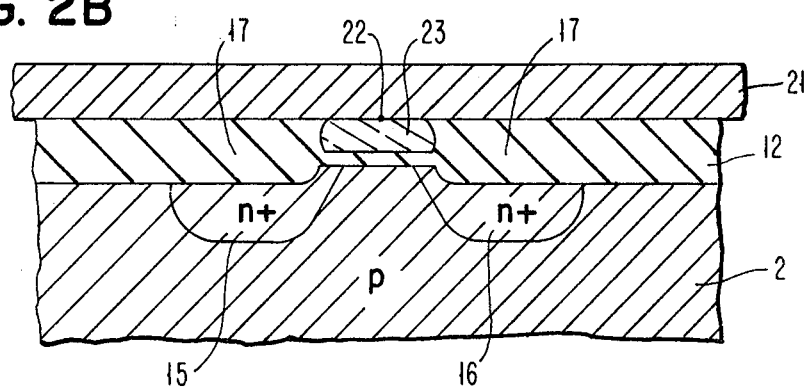
FIGS. 2B and 2C show cross sectional views through the nonoverlapping gate FET along the line indicated in FIG. 2A.

FIG. 2A shows a top view of an FET of the present invention having a "self-registering" electrical connection 22 between the polysilicon gate 23 and the metallic interconnection line 21 and wherein the polysilicon gate 23 is self-aligned with respect to the field oxide isolation 12 in its width direction and does not overlap the field isolation oxide. In contrast to the device shown in FIG. 1A, the sides of the polysilicon gate 23 shown in FIG. 2A are self-aligned with respect to the boundaries of the field isolation and, therefore, the gate does not overlap onto the field isolation. Also, in contrast to the device shown in FIG. 1A, there is no alignment area required between the gate and source and drain regions for the device of the present invention which is shown in FIG. 2A. When viewed in cross section, the new FET structure of FIG. 2A exhibits a highly planar topology in all directions (see FIGS. 2B and 2C) for deposition of the metallic layer. This highly planar topology relieves the lithographic delineation problems described above and also leads to an FET with a smaller gate area and a smaller total area than that of the device shown in FIG. 1A. Moreover, as illustrated in FIG. 2B, the field oxide is nonrecessed with respect to the top surfaces of the source and drain regions.

Figure 3A:
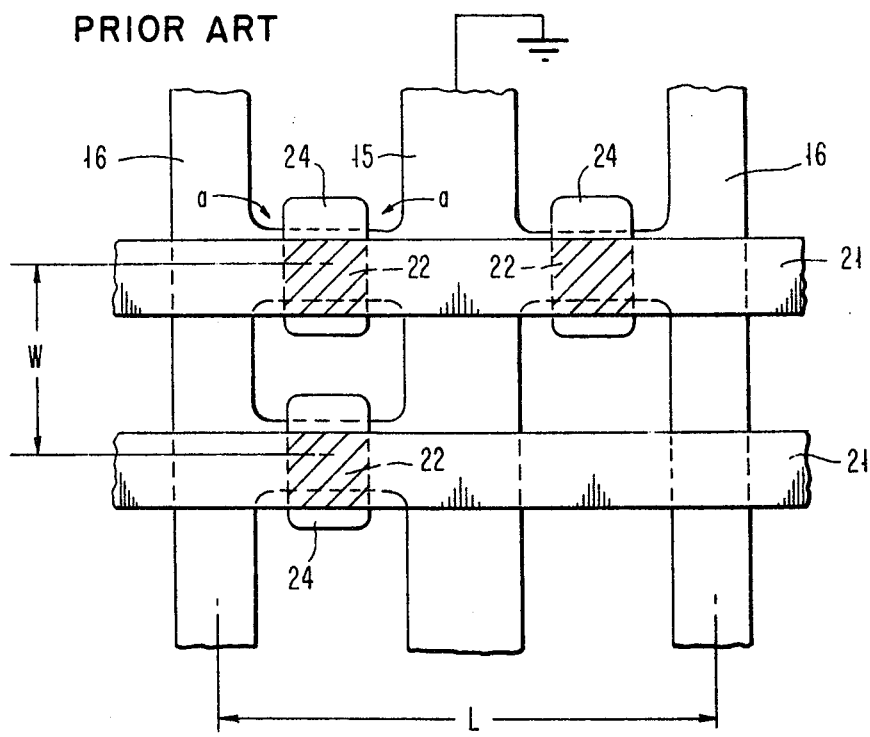
FIG. 3A shows a fragment of an array of an FET integrated circuit made using FETs with overlapping gates and misregistration tolerant gate contacts.
Figure 3B:
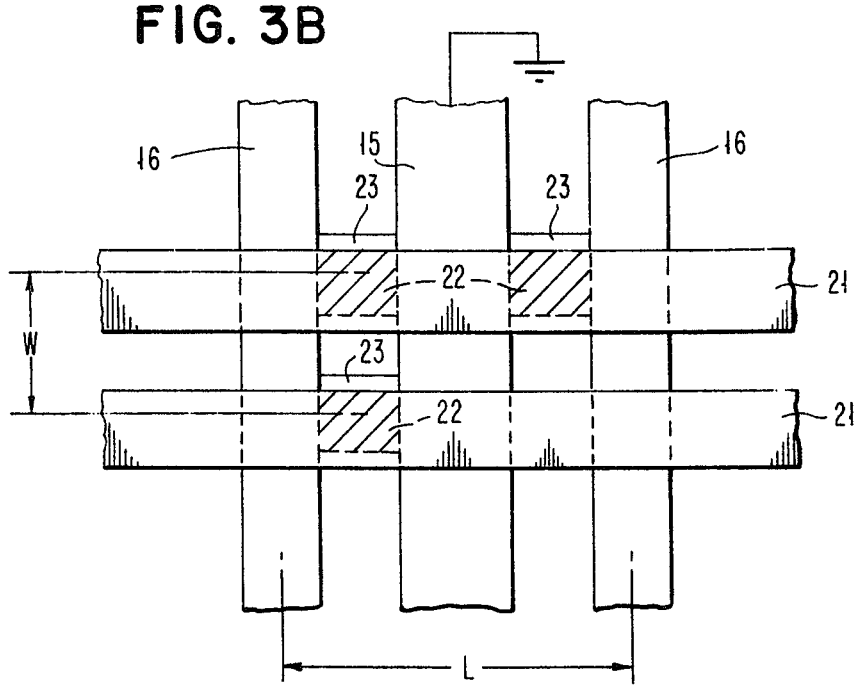
FIG. 3B shows a fragment of an array of an FET integrated circuit of this invention made using FETs with nonoverlapping gates and misregistration tolerant gate contacts.

The smaller FET structure of the present invention leads to integrated circuits with a higher device packing density as illustrated by comparing FIGS. 3A and 3B which show fragments of an array of an FET integrated circuit. FIG. 3A is a fragment of an FET array fabricated according to the overlapping gate method of Kalter et al, and FIG. 3B is a fragment of an FET array of the present invention wherein the gate does not overlap the field isolation. Both structures have self-registering electrical connections between the gate and the metallic interconnection lines. The fragments shown in FIG. 3A and FIG. 3B are exemplary of fragments of a programmable logic array or of a read-only memory array. Both fragments provide the same electrical function but the fragment shown in FIG. 3B as employed in the present invention is smaller in the width dimension, W, when fabricated with the same minimum lithographic feature size as that of FIG. 3A, and smaller in the length dimension, L, and hence the fragment of FIG. 3B is smaller in total area due to the nonoverlapping gate features of the present invention and due to the other self-registering features obtained by the present invention.

DESCRIPTION OF PREFERRED EMBODIMENTS

For convenience, the discussion of the fabrication steps of the present invention is directed to the preferred aspect of employing a p-type silicon substrate as the semiconductive substrate and n-type impurities as the diffused or implanted dopant impurities. This leads to the n-channel FET technology. Accordingly, it is understood that an n-type substrate and p-type diffused or implanted dopant impurities can be employed according to the present invention in the p-channel FET technology.

It is understood that when the discussion refers to n-type impurities, the process steps are applicable to p-type impurities and vice versa. Also, the present invention is applicable to substrates other than silicon which are known in the art. Also, as used herein, the terms "metallic-type interconnection lines" or "high-conductivity interconnection lines" refer to metal lines such as aluminum as well as to nonmetallic materials (e.g., highly doped polysilicon or intermetallic silicides) which nevertheless can have electrical conductivities sufficiently high enough to be useful in integrated circuits. Also, the terms "lines" and "stripes" are used interchangeably in reference to long, narrow, lithographically delineated regions. Moreover, the terms "polysilicon" and "polycrystalline silicon" are used herein interchangeably as in the prior art. Also, when reference is made to impurities of a "first type" and to impurities of the "second type", it is understood that the "first type" refers to n- or p-type impurities and "second type" refers to the opposite conductivity type. That is, if the "first type" is p, then the "second type" is n. If the "first type" is n, then the "second type" is p.

Figure 4A:
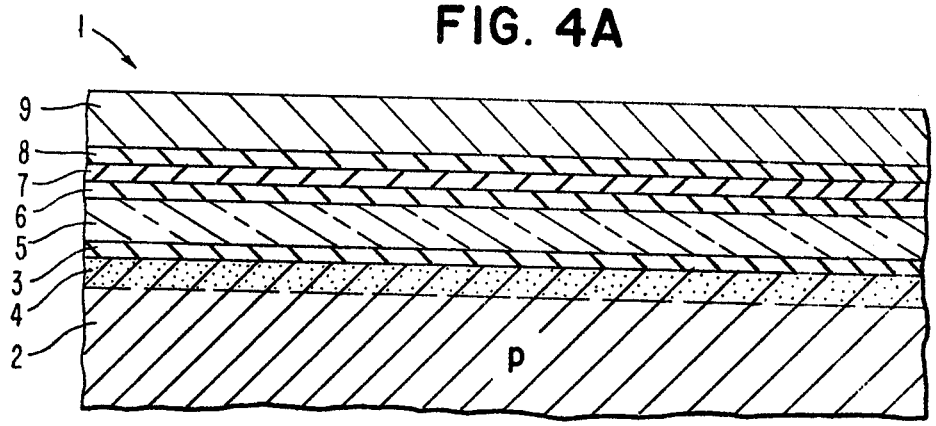
FIGS. 4A–4F are cross-sectional views of the FET in various stages of fabrication through the nonoverlapping gate FET of the present invention along the lines indicated in FIG. 5.

Referring to FIG. 4A, there is shown a fragment of the initial structure of the invention generally known as 1. A p-type semiconductive silicon substrate 2 having a desired crystallographic orientation (e.g., <100>) is prepared by slicing and polishing a p-type silicon boule grown in the presence of a p-type dopant such as boron following conventional crystal growth techniques. Other p-type dopants for silicon include aluminum, gallium, and indium.

A thin gate insulator 3 is grown on or deposited onto the silicon substrate 2. This gate insulator, which is about 200 to 1000 A thick, is preferably of silicon dioxide and is preferably formed by thermal oxidation of the silicon surface at 1000° C in the presence of dry oxygen. The p-type doping near the silicon surface can be increased by a low energy ion implantation, or by diffusion, of a p-type dopant. This extra surface doping layer 4, referred to as channel doping, is approximately 1000 to 5000 A deep and serves to increase the gate threshold voltage of the FET. The use of additional p-type doping for threshold adjustment is known in the art and is described, for example, by Rideout et al, in "Device Design Considerations for Ion Implanted n-Channel MOSFETs", IBM Journal of Research and Develop., Volume 19, pp. 50–59, January 1975. The channel doping is preferably formed by ion implantation of boron. The implantation may be performed before or preferably after forming the gate insulator. The boron ion implantation energy is about 50 KeV and the dosage is approximately $10^{12}$ cm$^{-2}$.

A layer of polysilicon 5 is then deposited. The polysilicon layer is approximately 1500 to 5000 A thick, and may be formed by chemical-vapor deposition. The polysilicon layer is doped with an n-type dopant such as arsenic, phosphorous, or antimony by one of several conventional techniques. Preferably, the polysilicon is doped with phosphorous and preferably uses the technique of depositing a POCl$_3$ layer and heating it to approximately 870° C to drive the phosphorus into the polysilicon making it n-type. After this the residual of the POCl$_3$ layer is removed by etching the wafer in buffered hydrofluoric acid. A thin surface protection layer of silicon dioxide 6 about 50 to 200 A thick can then be grown on or deposited onto the polysilicon layer to prevent a subsequently deposited oxidation barrier layer 7 from reacting with the polysilicon and thereby rendering it difficult to later remove the oxidation barrier layer.

An adherent oxidation barrier layer 7 of a nonoxidizing material such as silicon nitride aluminum nitride, boron nitride, aluminum oxide, or silicon carbide is then deposited. Preferably the layer 7 is of silicon nitride and is approximately 500 to 1000 A thick. The layer 7 may be deposited by conventional chemical-vapor deposition techniques. An additional layer of silicon dioxide 8 is then deposited. The silicon dioxide layer 8 is approximately 500 to 1000 A thick and may be formed by chemical vapor deposition.

Layer 8 serves as an etching mask to delineate the layer 7, and layer 7 serves as an etching mask to delineate predetermined geometrical patterns into the silicon dioxide layer 6, and as an oxidation barrier layer during subsequent growth of silicon dioxide over other parts of the structure. Layer 6 in turn serves as a mask to define patterns in polysilicon layer 5. The oxidation barrier layer material 7 should not oxidize or at most only oxidize extremely slowly relative to the oxidation rate of silicon and polysilicon. The oxidation barrier layer material is considered to be a nonoxidizing material under the conditions to which it is subjected in the method of the present invention. The oxidation barrier layer 7 is preferably a nitride such as silicon nitride and it prevents oxidation of the polysilicon layer 5 thereunder.

A pattern determining layer such as a layer of resist material 9 of the type employed in known lithographic masking and etching techniques is placed over the surface of the upper silicon dioxide layer 8. Any of the well-known photosensitive polymerizable resist materials known in the art may be used. The resist material is applied as by spinning on or by spraying. The resultant structure is shown in FIG. 4A.

Figure 5A:
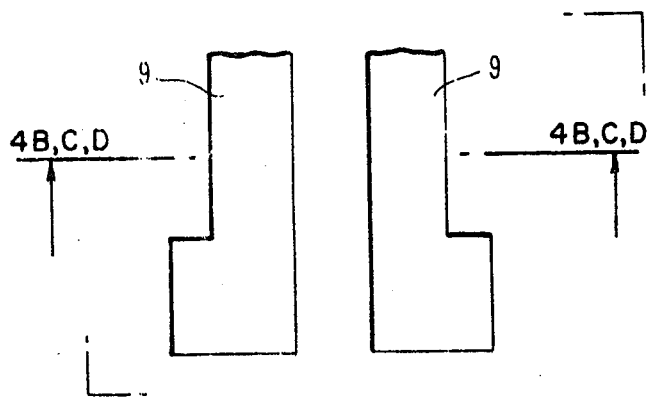
FIGS. 5A–5D show top views of the four basic lithographic masks for the nonoverlapping gate FET employed according to the present invention.

The layer of photoresist material 9 is dried and then selectively exposed to ultraviolet radiation through a photolithographic mask (see FIG. 5A). This mask is of a transparent material having opaque portions in a predetermined pattern. The masked wafer is subjected to ultraviolet light, polymerizing the portions of the resist material underlying the transparent regions of the mask. After removing the mask, the wafer is rinsed in a suitable developing solution which washes away the portions of the resist material which were under the opaque regions of the mask and thus not exposed to the ultraviolet light. The assembly may then be baked to further polymerize and harden the remaining resist material which conforms to the desired predetermined pattern, i.e., it leaves unprotected those regions wherein the sources and drains will subsequently be formed.

Figure 4B:
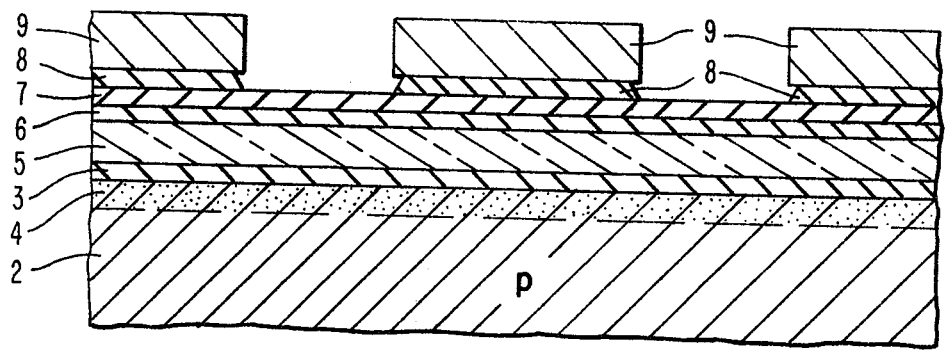

Next the structure is treated to remove the portions of the silicon dioxide 8 not protected by the resist material 9. The wafer is immersed in a solution of buffered hydrofluoric acid. The etching solution dissolves silicon dioxide but does not attack the resist, oxidation barrier layer 7 such as silicon nitride, or other materials of the assembly, as illustrated by FIG. 4B.

Figure 4C:
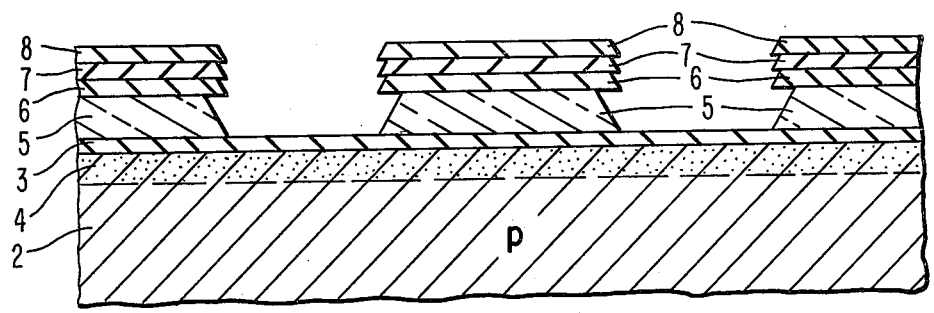
Figure 4D:
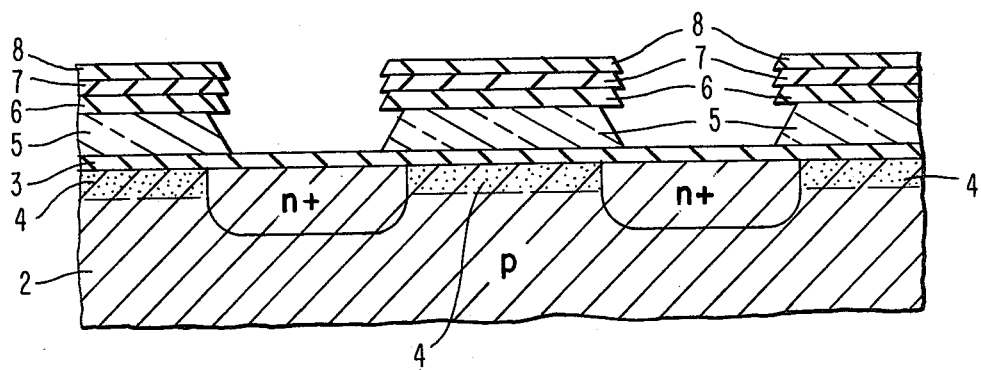

The photoresist material 9 above the etched silicon dioxide 8 is then removed by dissolving in a suitable solvent. The remaining silicon dioxide regions 8 conform to a predetermined pattern, and now serve as a mask for etching predetermined patterns in the oxidation barrier layer 7. Layer 7 then serves as a mask for etching patterns in the thin silicon dioxide layer 6, and layer 6 in turn serves as a mask for etching patterns in the polysilicon layer 5. The resultant structure is shown in FIG. 4C.

Patterns in the layer 7, when silicon nitride is employed, can be formed by etching in a phosphoric acid solution at 180° C. Patterns in the thin oxide layer 6 are formed by etching in a solution of buffered hydrofluoric acid. Patterns in the polysilicon layer 5 are formed by etching in a well-known etchant such as etylene diamine pyrocatechol at 100° C. This completes the first basic lithographic masking step which delineates the regions to be subsequently doped to provide the source and drain regions of the FET using the mask pattern shown in FIG. 5A. A cross section of the structure at this stage in the process is shown in FIG. 4C.

An important aspect of the present invention is that formation of the doped source and drain regions at this stage along with the use of the oxidation barrier layer 7 as a mask during subsequent steps for dilineating the polysilicon gate and the field isolation regions, provides for field isolation which is nonrecessed with respect to the source and drain regions, along with the type of self-registration between the gate and the source and drain regions whereby the need for the alignment space "a" shown in FIGS. 1A and 3A is eliminated.

Another aspect of the present invention is that the channel region, gate insulator, and gate conductor are formed at the initial stage of the fabrication process, thereby protecting the process-sensitive channel region and gate insulator from potentially detrimental effects such as contamination due to chemicals used to etch masking layers, and surface damage due to strain induced by pattern defining layers.

Moreover, since this oxidation barrier layer 7 acts as both the mask for delineating field isolation regions and as a mask for delineating the polysilicon gate, the polysilicon gate and the boundaries of the recessed field isolation silicon dioxide are self-registered with respect to each other. This eliminates the need for the overlap of the polysilicon gate onto the field isolation.

The multifunctional aspect of the oxidation barrier layer provides for considerable simplification of the process and facilitates device area reduction.

The n-type source and drain regions are now formed by well known ion implantations or diffusion techniques. For purposes of illustrating the method of the present invention, ion implantation has been selected. For instance, the n-type source and drain regions 15 and 16, respectively, can be formed 2000 A deep by an $As^{75}$ implantation of about 100 KeV energy and $4 \times 10^{15}$ $cm^{-2}$ dosage. During this souce and drain implantation, the polysilicon layer 5, the thin silicon-dioxide layer 6, the oxidation barrier layer 7, and the silicon-dioxide layer 8 acts as a blocking mask to prevent the implanted n-type dopant impurities from entering the FET channel region 14 under the polysilicon layer.

Since the insulator layer 3 is relatively thin, the doping for the source and drain regions can be provided by ion implantation through the layer 3 in the desired predetermined regions. Alternatively, if desired, the insulator layer 3 can be etched away in the desired predetermined regions corresponding to the source and drain regions, and then the doping can be provided by thermal diffusion or ion implantation. It is appreciated that the source and drain regions should extend under the gate electrode subsequently formed from layer 5.

Figure 5B:
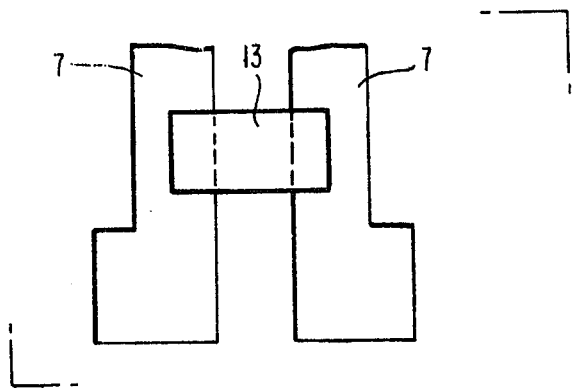

A gate pattern determining layer such as a layer of resist material of the type described previously is placed over the surface of the structure to again delineate the polysilicon layer. The resist material is exposed with ultraviolet radiation using a predetermined lithographic masking pattern shown in FIG. 5B, and the unexposed regions of the resist are dissolved away. This is the second basic lithographic masking step. As illustrated in FIG. 5B, the channel region 14 is defined by the orthogonal intersection of two lithographic line (i.e., stripe) patterns which result in a rectangular gate area which may have side dimensions equal to the minimum exposable line width.

The structure is immersed in a solution of buffered hydrofluoric acid which dissolves silicon dioxide layer 8 but does not attack the resist regions or the oxidation barrier layer 7, over the polysilicon gate regions. The remaining resist material above the etched silicon dioxide pattern is then removed by dissolving in a suitable solvent. At this stage in the process, the oxidation barrier masking layer 7 has been revealed over the subsequent field isolation regions. The revealed portions of layer 7, when the layer is of silicon nitride, can be removed by etching in a phosphoric acid solution at 180° C. The thin oxide layer 6 under the removed nitride layer 7 can then be removed by a short time or "dip" etch in a solution of buffered hydrofluoric acid.

Then the portions of the polysilicon layer 5 over the subsequent field isolation regions are removed by etching in a well known etchant such as ethylene diamine pyrocatechol at 100° C. This etching procedure does not attack other parts of the structure because they are covered by nitride or oxide. The etching step determines the geometrical shape of the polysilicon gate 23.

Figure 4E:
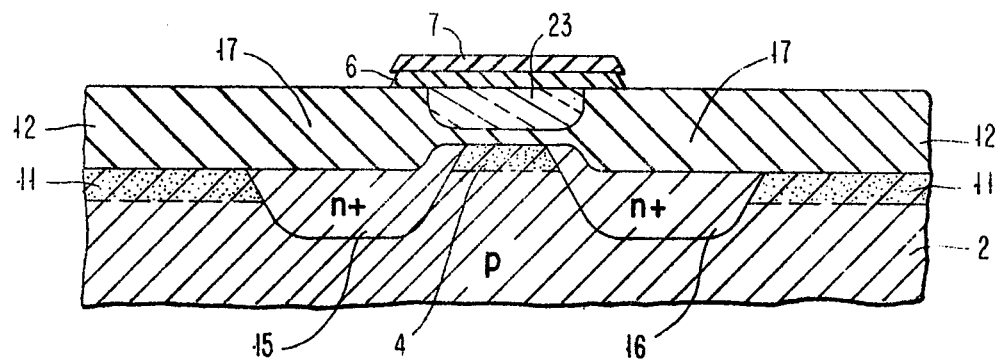

The p-type doping in the field isolation regions 10 can be increased by ion implantation, or by diffusion, of a p-type dopant (see FIG. 4E). This additional doping region 11, referred to as a parasitic channel stopper, serves to increase the voltage required to invert the silicon surface under the subsequently formed silicon dioxide field isolation regions. The use of additional p-type doping for prevention of surface inversion is known in the art and is described, for example, by Dennard et al. in U.S. Pat. No. 3,899,363. The channel stopper doping is preferably formed by ion implantation of boron. The boron ion implantation energy is about 65 KeV and the dosage is approximately $10^{13} cm^{-3}$. During implantation of the boron, the remining parts of layers 8, 7, 6, and 5 serve as a blocking mask to prevent implanted boron ions from entering the channel region beneath the polysilicon gate, or from entering the polysilicon material. Also, this p-type doping does not affect the n+ doped regions to any significant extent since such n+ regions employ much heavier doping than is provided at this time.

Next, a dielectric insulation layer 17 is formed above the source and drain regions 15 and 16, respectively, and over the field regions. Layer 17 electrically insulates the subsequently formed metallic interconnection line to the gate from the n-type source and drain regions. Formation of layer 17 also provides the field oxide 12. Accordingly, layer 17 should be as thick As possible.

By a suitable choice of the polysilicon layer thickness and the field oxide thickness, the field oxide 12 can be grown up level to the upper surface of the polysilicon or up to any other predetermined relative level. A cross-section of the resultant structure is shown in FIG. 4E.

The dielectric insulation 17 over the field regions and over the n-type source and drain regions is preferably formed by growing a silicon dioxide layer 1500 to 5000 A thick by thermal oxidation at 1000° C in the presence of steam. During this oxidation, about 600 to 2000 A of the silicon substrate over the n-type source and drain regions is converted to silicon dioxide. The n-type source and drain regions 15 and 16 are driven down into the substrate and laterally around the growing silicon dioxide as shown in FIG. 4G. Since the silicon dioxide tends to expel n-type dopants, the n-type dopant is not consumed to any significant extent during this oxidation. Also, the lateral diffusion of the n-type source and drain regions does not degrade the electrical characteristics of the FET to any significant degree.

In the final structure, the field isolation is nonrecessed with respect to the top of the source and drain regions. The thickness of the isolation above the source and drain regions may be somewhat different than the field isolation due to the effect of the dopants on the growth or oxidation rate. However, the bottom of the field oxide and the top of the source and drain regions are at substantially the same level thereby making the field isolation nonrecessed with respect to the top surfaces of the source and drain regions.

The top of the polysilicon gate is protected from oxidation by an oxidation barrier layer 7, whereas the ends of the gate at the source and drain boundaries are subjected to the oxidation, which desirably provides protective insulation up to the oxidation barrier layer 7. Oxidation of the sides of the polysilicon layer 5 beneficially insures that the field isolation will be in intimate physical contact with the boundary of the formed polysilicon gate.

Figure 4F:
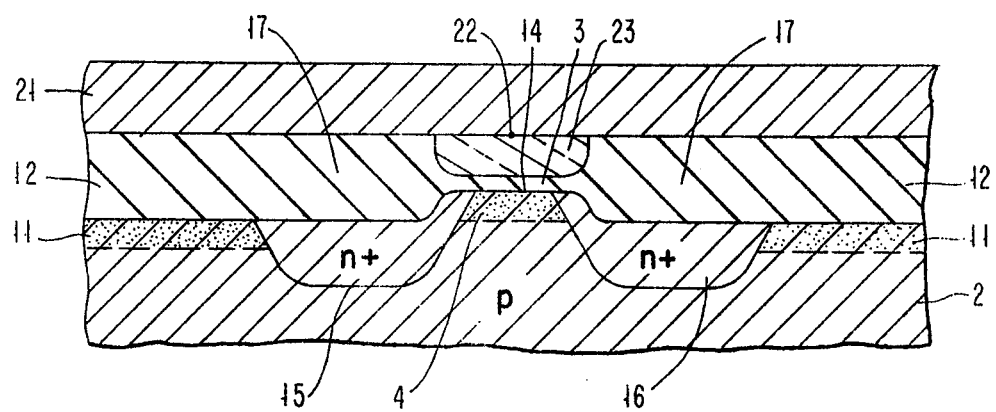

It is noted from FIG. 4F that the boundaries between the n-type source 15 and drain 16 regions, and the channel region 14 of the FET are determined by the edges of the polysilicon gate 23. This feature is generally referred to in the prior art as the "self-aligned gate technique". With the gate self-aligned with respect to the source and drain, the parasitic gate to source and drain overlap capacitances are advantageously reduced over nonself-aligned FET fabrication techniques. In the method of the present invention, the ends of the polysilicon gate are self-ligned with respect to the conductive source and drain regions, while the sides of the gate are self-aligned with respect to the nonconductive field isolation regions.

Next the polysilicon gates are revealed. First, any part of silicon dioxide layer 8 still remaining is now removed by a short time or "dip" etch in hydrofluoric acid. Next, the oxidation barrier layer 7 over the gates is removed by etching in a phosphoric acid solution at 180° C. Then the thin silicon dioxide layer 6 over the gates is removed by dip etching in a buffered hydrofluoric acid solution.

In fabricating FET integrated circuits, electrical connection is made to the FET source and drain regions and to the silicon substrate, as well as to the FET polysilicon gates. In some integrated circuit arrays such as one-device cell random access memory arrays, the source and drain connections do not occur in the array of FETS, but are located in the outerlying addressing, decoding, sensing and clocking circuits referred to as peripheral circuits. In other circuits, such as random logic arrays, the source and drain connections do occur within the array of FETs. The substrate contact is generally not located within the array of FETs. Electrical connection may be made to the top or to the bottom of the semiconductive substrate 2. Preferably, electrical connection is made to the top of the semiconductive substrate with the same pattern delineating steps that provide electrical connection to the source and drain regions, and is made concurrently therewith.

Figure 5C:
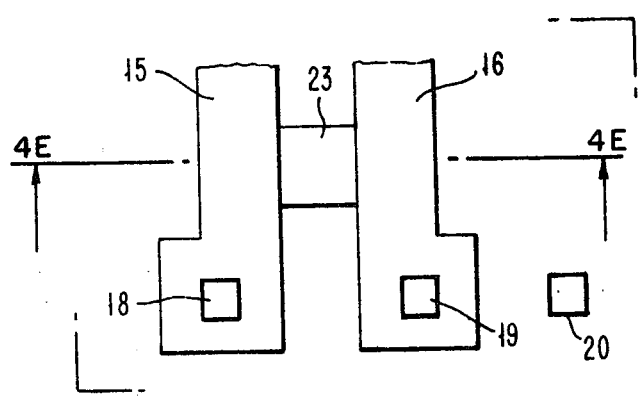

The source, drain, and substrate via holes or connection sites are made by applying a resist layer to the assembly. The resist material is exposed with ultraviolet radiation using a predetermined lithographic masking pattern shown in FIG. 5C and the unexposed regions of the resist are dissolved away. This is the third basic lithographic masking pattern defining operation. Next, the structure is treated to remove the portions of the thick silicon dioxide not protected by the resist material. The wafer is immersed in a solution of buffered hydrofluoric acid to provide contact holes or vias 18, 19, and 20 through the insulation and field oxide layers to allow electrical connection to be made to the source, drain and substrate, respectively.

The remaining resist above the etched silicon dioxide is then removed by dissolving in a suitable solvent. At this stage in the process the polysilicon gates and the source and drain and substrate regions in the contact holes 18, 19, and 20, respectively, have been revealed for contacting. The sequence of removing nonoxidizing layer 7, and then etching contact holes 18, 19, and 20 may be reversed without significantly affecting the final structure.

Next, the metallic-type highly conductive interconnection line material, 21, preferably a metal, is deposited. An example of a highly-conductive material commonly used for interconnection is aluminum which may contain relatively small amounts of impurities introduced to decrease electromigration effects or to prevent or reduce chemical reactions between the aluminum and the semiconductive material to be contacted. The highly-conductive material such as aluminum may be deposited by sputtering or preferably by evaporation.

It is noted that a barrier layer (not shown) may be placed between the aluminum and the silicon or polysilicon layers to prevent or reduce chemical reaction between the aluminum and the semiconductive material. The barrier layer may be of a metal such as titanium or chromium, or of an intermetallic silicide such as platinum silicide or palladium silicide.

Next, a photoresist layer is applied to the structure. The resist material is exposed with ultraviolet radiation using a predetermined lithographic masking pattern shown in FIG. 5D and the unexposed regions of the resist are dissolved away. This is the fourth basic lithographic masking operation. Then the structure is treated to remove the portions of the conductive material not protected by the resist pattern shown in FIG. 5D. When a barrier layer is employed under the conductive material, the pattern in the conductive material can serve as an etching mask for delineating the barrier layer.

Figure 2C:
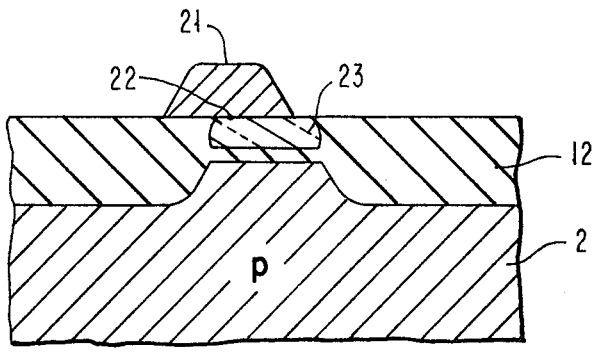
Figure 5D:
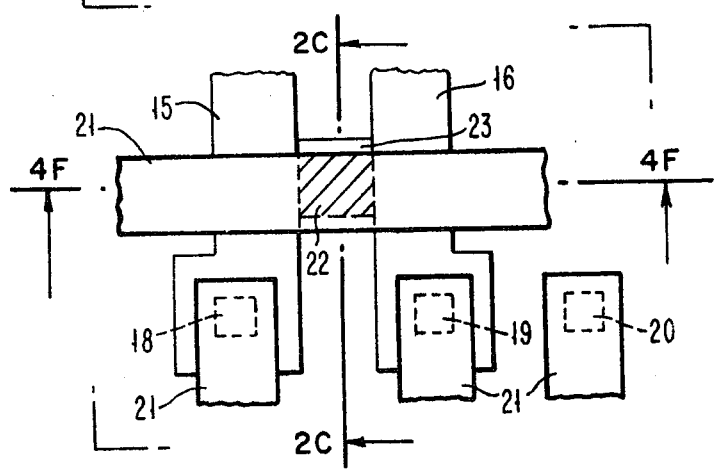
Figure 6A:
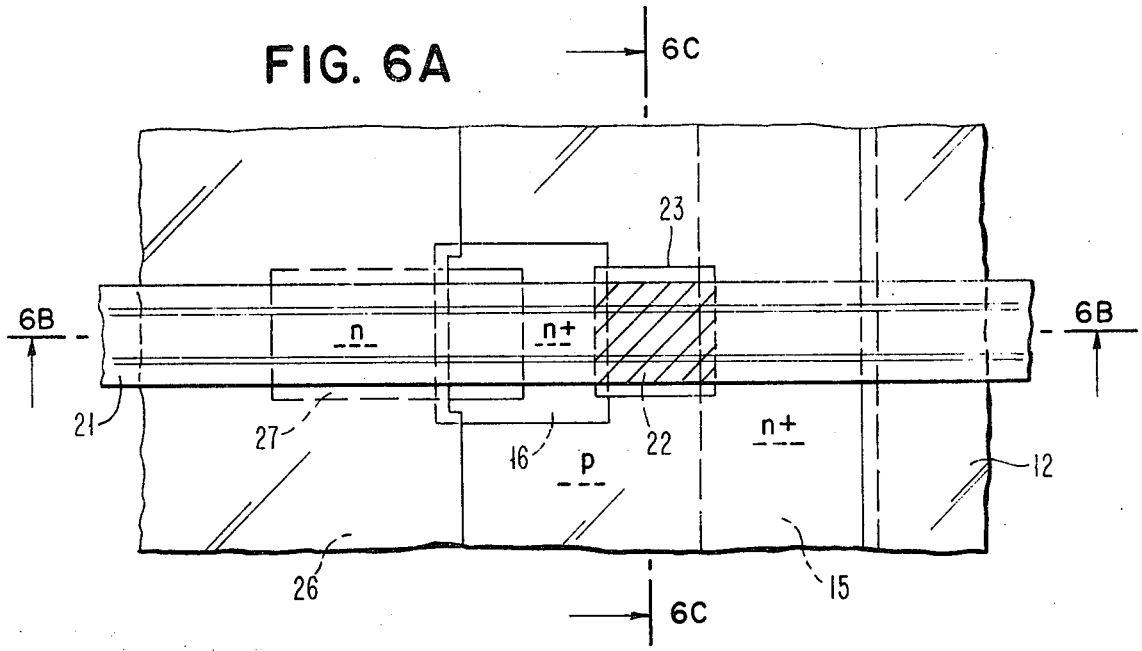
FIG. 6A illustrates a top view of an FET one-device cell of the present invention wherein the polysilicon gate of the FET switch does not overlap the field isolation.
Figure 6B:
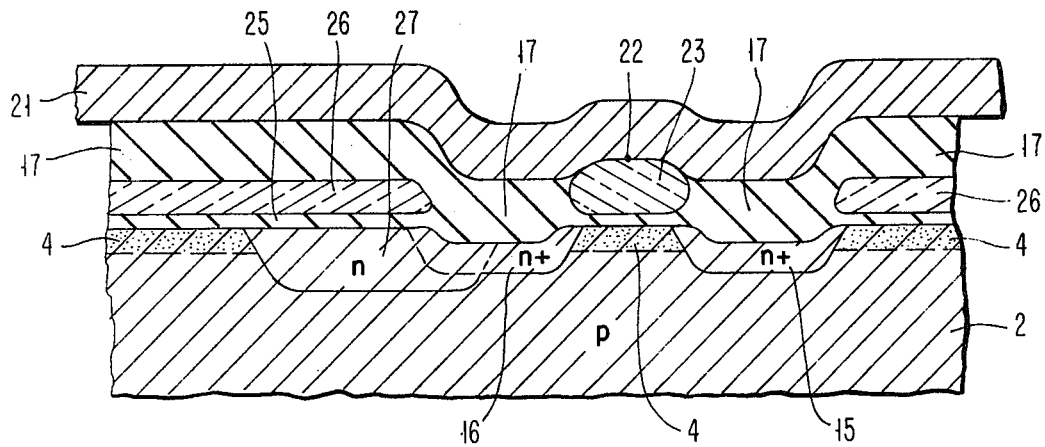
FIGS. 6B and 6C show cross-sectional views through the FET one-device cell along the lines indicated in FIG. 6A.
Figure 6C:
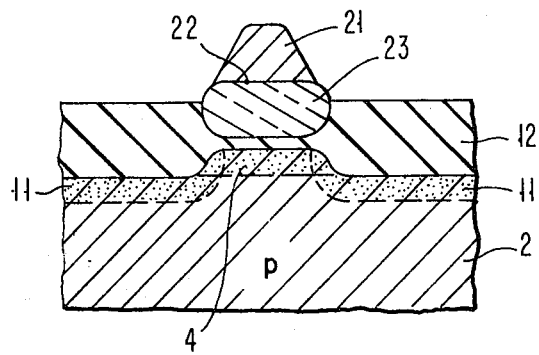

FIG. 5D illustrates a top view of an FET and representative metallic interconnection lines making a self-registered electrical connection 22 to the polysilicon gate 23, and conventional contact through holes or vias 18, 19, and 20 to n-type doped source and drain regions, and to p-type substrate regions, fabricated according to the present invention. A cross-sectional view through the channel from source to drain of the final FET structure of FIG. 5D is shown in FIGS. 2B and 4F. A cross-sectional view across the channel of the FET of FIG. 5D is shown in FIGS. 2C and 6C.

When using conventional etched contact hole in the present invention for connection between the metallic interconnection line and the polysilicon gate, high precision in registration between the polysilicon gate lithographic mask and the gate contact hole lithographic mask is required. Furthermore, when using a conventional etched contact hole, since only that portion of the gate revealed by the hole is available for contacting, precise registration between the gate contact hole lithographic mask and the metallic interconnection line lithographic mask is also required. In the "self-registering" gate contact method preferably employed in the present invention, the entire polysilicon gate area is revealed for contacting and the conductive material need merely to cross over any portion of the polysilicon gate in order to make electrical connection. Accordingly, this preferred misregistration tolerant aspect of the present invention reduces the required degree of registration precision between the polysilicon gate, contact hole, and interconnection line lithographic masks.

As known in the art, additional layers (not shown) may be provided over the metallic-type layer 21 such as sputtered silicon dioxide for the purpose of passivating the integrated circuit. Furthermore, as is known in the art, when desired, other masking steps may be used to provide vias through the passivation layer in order to make contact to the metallic interconnection layer or to the semiconductive substrate. In addition, when desired, electrical connection may be made to the back surface of the semiconductive substrate. Also, in addition to the photolithographic exposure technique using ultraviolet radiation described previously, the method of the present invention can utilize other lithographic masking (pattern delineating techniques) that use electron-beams, X-rays, or other radiation for exposure. Both p-channel and n-channel transistors FETs may be fabricated with the method of the present invention. Examples of integrated circuits that may be fabricated using the new FET structure of the present invention include random access logic arrays, programmable logic arrays, read-only memory arrays, sequentially accessed memory arrays, random access memory arrays, shift register arrays, bucket brigade shift register array, charge coupled shift register arrays, and random access arrays of one-device memory cells.

One-device memory cells include a single field-effect transistor (FET) switch and a conductor-insulator-semiconductor information storage capacitor. The FET is used to switch electronic charges (electrons) representing information into and out of the capacitor. Typically the charge storage capacitor is operated in two states, charged and uncharged, representing a binary "1" and "0". The upper electrode of the storage capacitor can be referred to as the plate of the one-device cell.

A particular type of one-device memory cell to which the present invention is advantageously directed is the one-device memory cell wherein the storage capacitor includes a doped lower capacitor electrode 27 beneath a polysilicon upper capacitor electrode 26. The same polysilicon layer provides for the upper capacitor electrode where it is positioned above the doped regions 27 and also provides for the polysilicon field shield 26 where it is not positioned above the doped regions 27. Such an FET one-device memory cell using an FET of the present invention is shown in FIG. 6.

In order to fabricate such a one-device cell, additional masking operations are employed to delineate the regions to be doped to provide the lower electrode of the charge storage capacitor, and to remove the oxidation barrier layer from above the upper electrode of the charge storage capacitor and the polysilicon field shield prior to the providing of the field oxide isolation. The doping for the lower electrode is provided prior to the steps for delineating the source and drain regions.

A one-device memory cell with a polysilicon field shield can be fabricated employing the additional steps to be described below prior to providing the gate insulator 3. A layer of silicon dioxide of approximately 2000 and 5000 A thick is formed on the silicon substrate 2. The layer can be formed by chemical vapor deposition. This layer serves as an etching mask to delineate a predetermined geometrical pattern in the silicon substrate to provide regions to be subsequently doped for achieving the lower electrode of the charge storage capacitor.

A layer of resist material of the type described previously for defining the gate pattern is used to define the region for the doped lower electrode of the charge storage capacitor. The resist material is applied, exposed with UV radiation using a predetermined lithographic mask pattern, and the unexposed regions of the resist are dissolved away. Next, the structure is treated to remove the portions of the silicon dioxide not protected by the resist material.

The wafer is immersed in a solution of buffered hydrofluoric acid which dissolves silicon dioxide but does not attack resist, silicon, or other materials of the assembly. If desired, for additional alignment assurances, the silicon not protected by the resist material and remaining silicon dioxide can be etched.

Next, an n-type implantation or diffusion is performed at this time to provide the doped lower electrode of the charge storage capacitor.

For purposes of illustrating the method of the present invention, ion implantation has been selected. For instance, the n-type doped lower electrode of the capacitor can be formed 2000 A deep by an $AS^{75}$ implantation of about 100 KeV energy and $4 \times 10^{15}$ cm$^{-2}$ dosage. During this implantation, the silicon-dioxide layer acts as a blocking mask to prevent the implanted n-type dopant impurities from entering regions of the substrate other than the lower electrode regions.

After this, the silicon dioxide layer is removed by etching such as by immersing the wafer in a solution of buffered hydrofluoric acid. After the silicon dioxide layer is removed, the thin gate insulator layer 3 is provided and the process proceeds as described above for the preparation of FETs in general up to the step wherein the polysilicon gate is delineated. At this point, the gate regions along with the field shield and upper electrode of the capacitor are delineated together.

After delineation of these regions, an additional lithographic masking step is carried out inorder to remove silicon nitride and silicon dioxide, if desired, from the polysilicon which defines the field shield upper electrode regions while maintaining the silicon nitride above the polysilicon regions which define the gates. For instance, a layer of resist material of the type described previously for defining the gate pattern is used to define the field shield and upper electrode regions as distinguished from the gate pattern. The resist material is applied, exposed with UV radiation using a predetermined lithographic mask pattern, and the unexposed regions of the resist are dissolved away. Next, the structure is treated to remove any portions of the silicon nitride not protected by the resist material. The silicon dioxide layer 6 above the field shield and upper electrode can be removed at this stage or can be retained, if desired, since the following steps involve providing the field isolation which is to insulate the field shield and the upper electrode. The process now proceeds in the same manner as described hereinabove for FETs in general.

Moreover, if it is desired to provide FETs with polysilicon field shield but not with storage capacitors, the just-described method can be used except that the steps employed for the lower electrode of the storage capacitor would, of course, not be used and the upper electrode of the capacitor would not be delineated. Likewise, if it is desired to provide one-device memory cells without field shield, the above-described method can be followed except that the field shield would not be delineated.

By following the present invention, FETs are obtained wherein the ends or edges of the gate are contiguous with the conductive source and drain regions since the edges of the FET and the source and drain regions are defined by the same photolithographic masking step. This eliminates the area identified as "a" in FIGS. 1A and 3A previously required for assuring alignment between the gate and source and drain regions. This alignment space is usually about one half of a line width. According, as illustrated in FIG. 3B, because the gate does not overlap onto the source and drain regions, such regions can exist closer together.

An important aspect of the present invention is that the field isolation is nonrecessed with respect to the upper surface of the FET source and drain regions. This in turn provides improved resistance to electrical leakage along with contributing to obtaining a highly planar surface topology upon which to delineate the metallic-type interconnection pattern.

Furthermore, by following the present invention, FETs are obtainable which are smaller than prior art FETs since the polysilicon gate and oxide isolation regions are self-registered with each other, thereby eliminating the need for overlap of the polysilicon on the oxide isolation. This in turn can lead to higher device packing density.

As described hereinabove, the present invention involves forming lithographic patterns twice in the same polysilicon layer using the same oxidation barrier masking layer and two separate lithographic masking steps. The first lithographic pattern delineates the source and drain regions, and the next pattern delineates the gate regions. The repeated delineation of a single oxidation barrier masking layer results in a reduction in the number of layers and process fabrication steps, thereby simplifying the process over other FET fabrication processes.

Another advantage of the present invention is that field shields can be provided wherein the polysilicon gates do not overlap the field shields as occurs in other processes. The present invention thereby makes it possible to eliminate the need for providing the relatively thin oxide isolation between the field shield and gate as required in other processes which leads to unwanted capacitance as well as reliability concerns. By following the present invention, thick isolation is provided around the field shield during the step of providing the field oxide isolation.

Another advantage of the present invention is that the channel region, gate insulator, and gate conductor are determined at the initial stage of the fabrication process, thereby protecting the process-sensitive channel region and gate insulator from potentially detrimental effects such as contamination due to chemicals used to etch masking layers, and surface damage due to strain induced by pattern defining layers.

A further advantage of the present invention is that the insulation oxide can be grown up level to the upper surface of the gate on all sides of the gate, thereby providing a highly planar surface topology upon which to delineate the metallic interconnection pattern.

Another advantage of the present invention is that electrical connection to the semiconductive substrate can be made using the pattern delineating steps that provide electrical connection to FET source and drain regions.

What is claimed is:

1. A field effect transistor (FET) which comprises:
   (A) semiconductive substrate of a first conductive type containing active impurities of a first conductive type;
   (B) FET channel regional containing active impurities of said first conductive type;
   (C) FET gate insulator over the channel region;
   (D) doped polycrystalline silicon gate over said channel region and said FET gate insulator; wherein the boundaries of said polycrystalline silicon gate determine the boundaries of said channel region in both the width and length directions;
   (E) doped source region of second and opposite conductive type; said source region being self-aligned with respect to one end of the FET gate in the length direction;
   (F) doped drain region of a second and opposite conductive type; said drain region being self-aligned with respect to the other end of the FET gate in the length direction;
   (G) field oxide to isolate said FET from other like FETs and from other structures and circuits on the same semiconductive substrate;
   (H) said field oxide being nonrecessed with respect to the source and drain regions;
   (I) said field oxide isolation being self-aligned with respect to the sides of the FET gate in the width direction, and said gate neither overlapping nor underlapping said field oxide isolation;
   (J) insulation layer at least over the FET source, and FET drain, but not over the FET gate;
   (K) a metallic-type high electrical conductivity interconnection line;
   (L) a self-registering electrical connection between the polycrystalline silicon gate and said interconnection line;
   (M) contact holes to provide vias for achieving electrical connection to FET source and drain regions;
   (N) metallic-type high electrical conductivity interconnection lines making electrical connection to said FET source and drain regions through said vias; and
   (O) electrical connections to said semiconductive substrate.

2. The field effect transistor of claim 1 wherein said semiconductive substrate is a p-type silicon substrate containing active p-type impurities.

3. The field effect transistor of claim 2 wherein said p-type impurity is selected from the group consisting of boron, aluminum, gallium, and indium.

4. The field effect transistor of claim 1 wherein said field oxide isolation is silicon dioxide.

5. The field effect transistor of claim 1 wherein said field oxide isolation has a parasitic channel stopper region beneath and beside it containing active impurities of a first conductive type.

6. The field effect transistor of claim 5 wherein the concentration of active impurities contained in said channel stopper region is greater than the concentration of active impurities in the semiconductive substrate.

7. The field effect transistor of claim 1 wherein said gate insulator is a layer of silicon dioxide.

8. The field effect transistor of claim 1 wherein said polycrystalline silicon gate is of a second conductive type.

9. The field effect transistor of claim 1 wherein said active impurity of a second conductive type is an n-type dopant.

10. The field effect transistor of claim 9 wherein said n-type dopant is arsenic, phosphorus, or antimony.

11. The field effect transistor of claim 1 wherein said interconnection line is a metal.

12. The field effect transistor of claim 11 wherein said metal is aluminum.

13. The field effect transistor of claim 1 which further comprises contact holes to provide vias for achieving electrical connection to the semiconductive substrate.

14. The field effect transistor of claim 1 which further comprises electrical connection to the back surface of the semiconductive substrate.

15. An integrated circuit array containing a plurality of the FETs of claim 1.

16. The integrated array of claim 15 wherein the array of FETs is a logic array.

17. The FET of claim 1 which further includes a polysilicon field shield.

18. A one-device memory cell which includes an FET of claim 17 and a charge storage capacitor.

19. The one-device memory cell of claim 18 wherein the upper electrode of said storage capacitor is of polysilicon and wherein the lower electrode of said storage capacitor is doped silicon.

20. An integrated circuit array containing a plurality of one-device memory cells of claim 18.

21. An integrated circuit array containing a plurality of FETs of claim 17.

22. An FET one-device memory cell of an FET switch of claim 1 and a charge storage capacitor.

23. The FET one-device memory cell of claim 22 wherein the upper electrode of said storage capacitor is of polysilicon and wherein the lower electrode of said storage capacitor is doped silicon.

24. An integrated circuit array containing a plurality of FET one-device memory cells of claim 22.

* * * * *

UNITED STATES PATENT AND TRADEMARK OFFICE
CERTIFICATE OF CORRECTION

PATENT NO. : 4,095,251
DATED : June 13, 1978
INVENTOR(S) : Robert H. Dennard et al It is certified that error appears in the above-identified patent and that said Letters Patent are hereby corrected as shown below:

Column 1, line 5, change "preent" to -- present --.

Column 3, line 13, change "structure" to -- structures --.

Column 7, line 3, change "describe" to -- described --.

Column 7, line 29, change "E" to -- (E) --.

Column 11, line 54, after "silicon nitride" insert a comma.

Column 12, line 56, change "etylene" to -- ethylene --.

Column 12, line 66, change "dilineating" to -- delineating --.

Column 14, line 39, change "As" to -- as --.

Column 15, line 23, change "self-ligned" to -- self-aligned --.

Column 19, line 6, change "According" to --- Accordingly --.

Signed and Sealed this

Nineteenth Day of December 1978

[SEAL]

Attest:

RUTH C. MASON
Attesting Officer

DONALD W. BANNER
Commissioner of Patents and Trademarks